(12) United States Patent
Shi

(10) Patent No.: US 10,204,562 B2
(45) Date of Patent: Feb. 12, 2019

(54) SCANNING DRIVING CIRCUITS AND DISPLAY PANELS

(71) Applicant: Shenzhen China Star Optoelectronics Technology Co., Ltd., Shenzhen, Guangdong (CN)

(72) Inventor: Longqiang Shi, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 97 days.

(21) Appl. No.: 15/325,149

(22) PCT Filed: Jan. 9, 2017

(86) PCT No.: PCT/CN2017/070620
§ 371 (c)(1),
(2) Date: Jan. 10, 2017

(87) PCT Pub. No.: WO2018/120289
PCT Pub. Date: Jul. 5, 2018

(65) Prior Publication Data
US 2018/0211604 A1    Jul. 26, 2018

(30) Foreign Application Priority Data
Dec. 26, 2016  (CN) .......................... 2016 1 12170958

(51) Int. Cl.
*G09G 3/20* (2006.01)
*G09G 3/36* (2006.01)
*G09G 3/3266* (2016.01)

(52) U.S. Cl.
CPC ............. *G09G 3/3266* (2013.01); *G09G 3/20* (2013.01); *G09G 3/3677* (2013.01); *G09G 2310/08* (2013.01); *G09G 2330/021* (2013.01)

(58) Field of Classification Search
CPC ........................... G09G 3/3674; G09G 3/3677
See application file for complete search history.

(56) References Cited

U.S. PATENT DOCUMENTS

2003/0231735 A1* 12/2003 Moon .................. G09G 3/3685
377/64
2007/0104307 A1    5/2007 Kim et al.
(Continued)

FOREIGN PATENT DOCUMENTS

| CN | 102637401 A | 8/2012 |
| CN | 102708776 A | 10/2012 |
| CN | 102867543 A | 1/2013 |

*Primary Examiner* — Kevin M Nguyen
(74) *Attorney, Agent, or Firm* — Andrew C. Cheng

(57) ABSTRACT

The pull-down control signal point relates to a scanning driving circuit and a display panel. The scanning driving circuit includes a pull-up control circuit configured for pulling up a level of a pull-up control signal point to be a high level or for pulling down the level of the pull-up control signal point to be a low level, a pull-down control circuit configured for pulling down the level of a pull-down control signal point to be the high level or for pulling down the level of the pull-down control signal point to be the low level, and the pull-down control circuit connects to the pull-up control circuit, and a scanning output circuit connects to the pull-up control circuit and the pull-down control circuit, and the scanning output circuit is configured for outputting the scanning driving signals of the high level or of the low level.

15 Claims, 3 Drawing Sheets

(56) References Cited

U.S. PATENT DOCUMENTS

2011/0273434 A1   11/2011  Park et al.
2016/0267867 A1*  9/2016  Brown ................ G09G 3/3677
2016/0322115 A1   11/2016  Xu et al.

* cited by examiner

SCANNING DRIVING CIRCUITS AND DISPLAY PANELS

BACKGROUND OF THE INVENTION

1. Field of the Invention

The present disclosure relates to display technology, and more particularly to a scanning driving circuit and a display panel.

2. Discussion of the Related Art

Gate driver on Array (GOA) technology contributes to narrow-border design of display panels and low cost, and thus has been widely adopted and developed. Indium gallium zinc oxide (IGZO) is a very popular thin film transistor (TFT) active layer. IGZO TFTs have been characterized by attributes such as high mobility rate and good stability. Not only the complicated degree of the GOA circuit may be reduced, but also the dimension of the TFT, with respect to the a-Si, of the GOA circuit may be smaller. Such attribute contributes to the narrow-border design, also, the performance of the TFTs may be enhanced and the number of the TFTs may be decreased. As such, the circuit is simple, and the power consumption may be reduced. However, only a few of GOA circuits adopt IGZO, and thus, the circuit design is complex and the number of powers is great, which increases the power consumption.

SUMMARY

The present disclosure relates to a scanning driving circuit and a display panel for reducing a number of power supply and the number of TFTs so as to simplify the circuit and to reduce the power consumption.

In one aspect, a scanning driving circuit includes: a pull-up control circuit configured to pull up a level of a pull-up control signal point to be a high level; a pull-down control circuit configured to pull down the level of the pull-down control signal point to be the low level, and connected to the pull-up control circuit; a scanning output circuit connected to the pull-up control circuit and the pull-down control circuit, and configured to output the scanning driving signals of the high level or of the low level in accordance with the level of the pull-up control signal point or the level of the pull-down control signal point; the pull-up control circuit includes a first controllable transistor (T1) and a second controllable transistor (T2), a control end of the first controllable transistor (T1) receives high-level transfer signals, a first end of the first controllable transistor (T1) receives a turn-on voltage (VGH), a second end of the first controllable transistor (T1) is connected to a first end of the second controllable transistor (T2), the pull-down control circuit, and the scanning output circuit; a control end of the second controllable transistor (T2) is connected to the pull-down control circuit and the scanning output, and a second end of the second controllable transistor (T2) is connected to the pull-down control circuit and the scanning output 30 to receive a turn-off voltage (VSS); the pull-down control circuit includes a third controllable transistor through a ninth controllable transistor (T3-T9), a control end of the third controllable transistor (T3) receives low-level transfer signals, a first end of the third controllable transistor (T3) is connected to a first end of the sixth controllable transistor (T6) and a first end of the eighth controllable transistor (T8) and receives the turn-on voltage (VGH), a second end of the third controllable transistor (T3) is connected to a first end of the fourth controllable transistor (T4), a first end of the fifth controllable transistor (T5), the seventh controllable transistor (T7) and the ninth controllable transistor (T9), a second end of the ninth controllable transistor (T9), and a control end of the second controllable transistor (T2); a control end of the fourth controllable transistor (T4) is connected to the second end of the first controllable transistor (T1), a second end of the fourth controllable transistor (T4) is connected to a second end of the fifth controllable transistor (T5), the second end of the second controllable transistor (T2), and the scanning output circuit, and the second end of the fourth controllable transistor (T4) receives the turn-off voltage (VSS); a control end of the fifth controllable transistor (T5) receives high-level scanning signals, a control end of the sixth controllable transistor (T6) receives first clock signals, a second end of the sixth controllable transistor (T6) is connected to a first end of the seventh controllable transistor (T7), a control end of the seventh controllable transistor (T7) receives the second clock signals, a control end of the eighth controllable transistor (T8) receives the third clock signals, a second end of the eighth controllable transistor (T8) is connected to a first end of the ninth controllable transistor (T9), and a control end of the ninth controllable transistor (T9) receives the fourth clock signals; the scanning output circuit includes a tenth controllable transistor (T10) through a thirteenth controllable transistor (T13) and a capacitor (C1), a control end of the tenth controllable transistor (T10) is connected to the second end of the first controllable transistor (T1), the first end of the second controllable transistor (T2), and a control end of the eleventh controllable transistor (T11), a first end of the tenth controllable transistor (T10) is connected to a first end of the eleventh controllable transistor (T11) and receives the fourth clock signals, a second end of the tenth controllable transistor (T10) receives current-level transfer signals, a second end of the eleventh controllable transistor (T11) is connected to a scanning signal output end for outputting the current-level transfer signals and a first end of the thirteenth controllable transistor (T13), a control end of the thirteenth controllable transistor (T13) receives the second clock signals, a second end of the thirteenth controllable transistor (T13) is connected to the second end of the twelfth controllable transistor (T12), the second end of the second controllable transistor (T2), the second end of the fifth controllable transistor (T5), and the second end of the fourth controllable transistor (T4), and receives the turn-off voltage (VSS); a control end of the twelfth controllable transistor (T12) is connected to the control end of the second controllable transistor (T2), a first end of the twelfth controllable transistor (T12) is connected to the second end of the eleventh controllable transistor (T11), the first end of the thirteenth controllable transistor (T13), and the scanning signal output end; and the capacitor (C1) connects between the control end of the tenth controllable transistor (T10) and the first end of the twelfth controllable transistor (T12); the first through the thirteenth controllable transistors (T1-T13) are N-type IGZO TFTs, and the control ends, the first ends, and the second ends of the first through the thirteenth controllable transistors (T1-T13) respectively corresponds to a gate, a drain, and a source of the N-type IGZO TFTs; and the level of the second clock signals is opposite to that of the fourth clock signals, and the level of the third clock signals is opposite to that of the first clock signals, a duty cycle ratio of the first to the fourth clock signals (CK1-CK4) is 50%, an overlapped period of two adjacent clock signals is about half of the width of the clock signals, a voltage of the first to the fourth clock signals (CK1-CK4) is in a range from −8V to 28V, the turn-on voltage (VGH) is 29V, and the turn-off voltage (VSS) is −6V.

In another aspect, a scanning driving circuit includes: a pull-up control circuit configured to pull up a level of a pull-up control signal point to be a high level; a pull-down control circuit configured to pull down the level of the pull-down control signal point to be the low level, and connected to the pull-up control circuit; and a scanning output circuit connected to the pull-up control circuit and the pull-down control circuit, and configured to output the scanning driving signals of the high level or of the low level in accordance with the level of the pull-up control signal point or the level of the pull-down control signal point.

Wherein the pull-up control circuit includes a first controllable transistor (T1) and a second controllable transistor (T2), a control end of the first controllable transistor (T1) receives high-level transfer signals, a first end of the first controllable transistor (T1) receives a turn-on voltage (VGH), a second end of the first controllable transistor (T1) is connected to a first end of the second controllable transistor (T2), the pull-down control circuit, and the scanning output circuit; and a control end of the second controllable transistor (T2) is connected to the pull-down control circuit and the scanning output, and a second end of the second controllable transistor (T2) is connected to the pull-down control circuit and the scanning output 30 to receive a turn-off voltage (VSS).

Wherein the pull-down control circuit includes a third controllable transistor through a ninth controllable transistor (T3-T9), a control end of the third controllable transistor (T3) receives low-level transfer signals, a first end of the third controllable transistor (T3) is connected to a first end of the sixth controllable transistor (T6) and a first end of the eighth controllable transistor (T8) and receives the turn-on voltage (VGH), a second end of the third controllable transistor (T3) is connected to a first end of the fourth controllable transistor (T4), a first end of the fifth controllable transistor (T5), the seventh controllable transistor (T7) and the ninth controllable transistor (T9), a second end of the ninth controllable transistor (T9), and a control end of the second controllable transistor (T2); a control end of the fourth controllable transistor (T4) is connected to the second end of the first controllable transistor (T1), a second end of the fourth controllable transistor (T4) is connected to a second end of the fifth controllable transistor (T5), the second end of the second controllable transistor (T2), and the scanning output circuit, and the second end of the fourth controllable transistor (T4) receives the turn-off voltage (VSS); a control end of the fifth controllable transistor (T5) receives high-level scanning signals, a control end of the sixth controllable transistor (T6) receives first clock signals, a second end of the sixth controllable transistor (T6) is connected to a first end of the seventh controllable transistor (T7), a control end of the seventh controllable transistor (T7) receives the second clock signals, a control end of the eighth controllable transistor (T8) receives the third clock signals, a second end of the eighth controllable transistor (T8) is connected to a first end of the ninth controllable transistor (T9), and a control end of the ninth controllable transistor (T9) receives the fourth clock signals.

Wherein the scanning output circuit includes a tenth controllable transistor (T10) through a thirteenth controllable transistor (T13) and a capacitor (C1), a control end of the tenth controllable transistor (T10) is connected to the second end of the first controllable transistor (T1), the first end of the second controllable transistor (T2), and a control end of the eleventh controllable transistor (T11), a first end of the tenth controllable transistor (T10) is connected to a first end of the eleventh controllable transistor (T11) and receives the fourth clock signals, a second end of the tenth controllable transistor (T10) receives current-level transfer signals, a second end of the eleventh controllable transistor (T11) is connected to a scanning signal output end for outputting the current-level transfer signals and a first end of the thirteenth controllable transistor (T13), a control end of the thirteenth controllable transistor (T13) receives the second clock signals, a second end of the thirteenth controllable transistor (T13) is connected to the second end of the twelfth controllable transistor (T12), the second end of the second controllable transistor (T2), the second end of the fifth controllable transistor (T5), and the second end of the fourth controllable transistor (T4), and receives the turn-off voltage (VSS); a control end of the twelfth controllable transistor (T12) is connected to the control end of the second controllable transistor (T2), a first end of the twelfth controllable transistor (T12) is connected to the second end of the eleventh controllable transistor (T11), the first end of the thirteenth controllable transistor (T13), and the scanning signal output end; and the capacitor (C1) connects between the control end of the tenth controllable transistor (T10) and the first end of the twelfth controllable transistor (T12).

Wherein the first through the thirteenth controllable transistors (T1-T13) are N-type IGZO TFTs, and the control ends, the first ends, and the second ends of the first through the thirteenth controllable transistors (T1-T13) respectively corresponds to a gate, a drain, and a source of the N-type IGZO TFTs.

Wherein the level of the second clock signals is opposite to that of the fourth clock signals, and the level of the third clock signals is opposite to that of the first clock signals, a duty cycle ratio of the first to the fourth clock signals (CK1-CK4) is 50%, an overlapped period of two adjacent clock signals is about half of the width of the clock signals, a voltage of the first to the fourth clock signals (CK1-CK4) is in a range from −8V to 28V, the turn-on voltage (VGH) is 29V, and the turn-off voltage (VSS) is −6V.

Wherein the pull-down control circuit includes a third controllable transistor through a ninth controllable transistor (T3-T9), a control end of the third controllable transistor (T3) receives low-level transfer signals, a first end of the third controllable transistor (T3) is connected to a first end of the sixth controllable transistor (T6) and a first end of the eighth controllable transistor (T8) and receives the turn-on voltage (VGH), a second end of the third controllable transistor (T3) is connected to a first end of the fourth controllable transistor (T4), a first end of the fifth controllable transistor (T5), the seventh controllable transistor (T7) and the ninth controllable transistor (T9), a second end of the ninth controllable transistor (T9), and a control end of the second controllable transistor (T2); a control end of the fourth controllable transistor (T4) is connected to the second end of the first controllable transistor (T1), a second end of the fourth controllable transistor (T4) is connected to a second end of the fifth controllable transistor (T5), the second end of the second controllable transistor (T2), and the scanning output circuit, and the second end of the fourth controllable transistor (T4) receives the turn-off voltage (VSS); a control end of the fifth controllable transistor (T5) receives high-level scanning signals, a control end of the sixth controllable transistor (T6) receives second clock signals, a second end of the sixth controllable transistor (T6) is connected to a first end of the seventh controllable transistor (T7), a control end of the seventh controllable transistor (T7) receives the third clock signals, a control end of the eighth controllable transistor (T8) receives the fourth clock signals, a second end of the eighth controllable transistor (T8) is connected to a first end of the ninth controllable transistor (T9), and a control end of the ninth controllable transistor (T9) receives the first clock signals; wherein the scanning output circuit includes a tenth controllable transistor (T10) through a thirteenth controllable transistor (T13) and a capacitor (C1), a control end of the tenth controllable transistor (T10) is connected to the second end of the first controllable transistor (T1), the first end of the second controllable transistor (T2), and a control end of the eleventh controllable transistor (T11), a first end of the tenth controllable transistor (T10) is connected to a first end of the eleventh controllable transistor (T11) and receives the fourth clock signals, a second end of the tenth controllable transistor (T10) receives current-level transfer signals, a second end of the eleventh controllable transistor (T11) is connected to a scanning signal output end for outputting the current-level transfer signals and a first end of the thirteenth controllable transistor (T13), a control end of the thirteenth controllable transistor (T13) receives the second clock signals, a second end of the thirteenth controllable transistor (T13) is connected to the second end of the twelfth controllable transistor (T12), the second end of the second controllable transistor (T2), the second end of the fifth controllable transistor (T5), and the second end of the fourth controllable transistor (T4), and receives the turn-off voltage (VSS); a control end of the twelfth controllable transistor (T12) is connected to the control end of the second controllable transistor (T2), a first end of the twelfth controllable transistor (T12) is connected to the second end of the eleventh controllable transistor (T11), the first end of the thirteenth controllable transistor (T13), and the scanning signal output end; and the capacitor (C1) connects between the control end of the tenth controllable transistor (T10) and the first end of the twelfth controllable transistor (T12).

Wherein the pull-down control circuit includes a third controllable transistor through a ninth controllable transistor (T3-T9), a control end of the third controllable transistor (T3) receives low-level transfer signals, a first end of the third controllable transistor (T3) is connected to a first end of the sixth controllable transistor (T6) and a first end of the eighth controllable transistor (T8) and receives the turn-on voltage (VGH), a second end of the third controllable transistor (T3) is connected to a first end of the fourth controllable transistor (T4), a first end of the fifth controllable transistor (T5), the seventh controllable transistor (T7) and the ninth controllable transistor (T9), a second end of the ninth controllable transistor (T9), and a control end of the second controllable transistor (T2); a control end of the fourth controllable transistor (T4) is connected to the second end of the first controllable transistor (T1), a second end of the fourth controllable transistor (T4) is connected to a second end of the fifth controllable transistor (T5), the second end of the second controllable transistor (T2), and the scanning output circuit, and the second end of the fourth controllable transistor (T4) receives the turn-off voltage (VSS); a control end of the fifth controllable transistor (T5) receives high-level scanning signals, a control end of the sixth controllable transistor (T6) receives third clock signals, a second end of the sixth controllable transistor (T6) is connected to a first end of the seventh controllable transistor (T7), a control end of the seventh controllable transistor (T7) receives the fourth clock signals, a control end of the eighth controllable transistor (T8) receives the first clock signals, a second end of the eighth controllable transistor (T8) is connected to a first end of the ninth controllable transistor (T9), and a control end of the ninth controllable transistor (T9) receives the second clock signals; wherein the scanning output circuit includes a tenth controllable transistor (T10) through a thirteenth controllable transistor (T13) and a capacitor (C1), a control end of the tenth controllable transistor (T10) is connected to the second end of the first controllable transistor (T1), the first end of the second controllable transistor (T2), and a control end of the eleventh controllable transistor (T11), a first end of the tenth controllable transistor (T10) is connected to a first end of the eleventh controllable transistor (T11) and receives the fourth clock signals, a second end of the tenth controllable transistor (T10) receives current-level transfer signals, a second end of the eleventh controllable transistor (T11) is connected to a scanning signal output end for outputting the current-level transfer signals and a first end of the thirteenth controllable transistor (T13), a control end of the thirteenth controllable transistor (T13) receives the second clock signals, a second end of the thirteenth controllable transistor (T13) is connected to the second end of the twelfth controllable transistor (T12), the second end of the second controllable transistor (T2), the second end of the fifth controllable transistor (T5), and the second end of the fourth controllable transistor (T4), and receives the turn-off voltage (VSS); a control end of the twelfth controllable transistor (T12) is connected to the control end of the second controllable transistor (T2), a first end of the twelfth controllable transistor (T12) is connected to the second end of the eleventh controllable transistor (T11), the first end of the thirteenth controllable transistor (T13), and the scanning signal output end; and the capacitor (C1) connects between the control end of the tenth controllable transistor (T10) and the first end of the twelfth controllable transistor (T12).

Wherein the pull-down control circuit includes a third controllable transistor through a ninth controllable transistor (T3-T9), a control end of the third controllable transistor (T3) receives low-level transfer signals, a first end of the third controllable transistor (T3) is connected to a first end of the sixth controllable transistor (T6) and a first end of the eighth controllable transistor (T8) and receives the turn-on voltage (VGH), a second end of the third controllable transistor (T3) is connected to a first end of the fourth controllable transistor (T4), a first end of the fifth controllable transistor (T5), the seventh controllable transistor (T7) and the ninth controllable transistor (T9), a second end of the ninth controllable transistor (T9), and a control end of the second controllable transistor (T2); a control end of the fourth controllable transistor (T4) is connected to the second end of the first controllable transistor (T1), a second end of the fourth controllable transistor (T4) is connected to a second end of the fifth controllable transistor (T5), the second end of the second controllable transistor (T2), and the scanning output circuit, and the second end of the fourth controllable transistor (T4) receives the turn-off voltage (VSS); a control end of the fifth controllable transistor (T5) receives high-level scanning signals, a control end of the sixth controllable transistor (T6) receives fourth clock signals, a second end of the sixth controllable transistor (T6) is connected to a first end of the seventh controllable transistor (T7), a control end of the seventh controllable transistor (T7) receives the first clock signals, a control end of the eighth controllable transistor (T8) receives the first clock signals, a second end of the eighth controllable transistor (T8) is connected to a second end of the ninth controllable transistor (T9), and a control end of the ninth controllable transistor (T9) receives the third clock signals; wherein the scanning output circuit includes a tenth controllable transistor (T10) through a thirteenth controllable transistor (T13) and a capacitor (C1), a control end of the tenth controllable transistor (T10) is connected to the second end of the first controllable transistor (T1), the first end of the second controllable transistor (T2), and a control end of the eleventh controllable transistor (T11), a first end of the tenth controllable transistor (T10) is connected to a first end of the eleventh controllable transistor (T11) and receives the fourth clock signals, a second end of the tenth controllable transistor (T10) receives current-level transfer signals, a second end of the eleventh controllable transistor (T11) is connected to a scanning signal output end for outputting the current-level transfer signals and a first end of the thirteenth controllable transistor (T13), a control end of the thirteenth controllable transistor (T13) receives the second clock signals, a second end of the thirteenth controllable transistor (T13) is connected to the second end of the twelfth controllable transistor (T12), the second end of the second controllable transistor (T2), the second end of the fifth controllable transistor (T5), and the second end of the fourth controllable transistor (T4), and receives the turn-off voltage (VSS); a control end of the twelfth controllable transistor (T12) is connected to the control end of the second controllable transistor (T2), a first end of the twelfth controllable transistor (T12) is connected to the second end of the eleventh controllable transistor (T11), the first end of the thirteenth controllable transistor (T13), and the scanning signal output end; and the capacitor (C1) connects between the control end of the tenth controllable transistor (T10) and the first end of the twelfth controllable transistor (T12).

In another aspect, a display panel includes: a scanning driving circuit includes: a pull-up control circuit configured to pull up a level of a pull-up control signal point to be a high level; a pull-down control circuit configured to pull down the level of the pull-down control signal point to be the low level, and connected to the pull-up control circuit; and a scanning output circuit connected to the pull-up control circuit and the pull-down control circuit, and the scanning output circuit is configured to output the scanning driving signals of the high level or of the low level in accordance with the level of the pull-up control signal point or the level of the pull-down control signal point.

Wherein the pull-up control circuit includes a first controllable transistor (T1) and a second controllable transistor (T2), a control end of the first controllable transistor (T1) receives high-level transfer signals, a first end of the first controllable transistor (T1) receives a turn-on voltage (VGH), a second end of the first controllable transistor (T1) is connected to a first end of the second controllable transistor (T2), the pull-down control circuit, and the scanning output circuit; and a control end of the second controllable transistor (T2) is connected to the pull-down control circuit and the scanning output, and a second end of the second controllable transistor (T2) is connected to the pull-down control circuit and the scanning output 30 to receive a turn-off voltage (VSS).

Wherein the pull-down control circuit includes a third controllable transistor through a ninth controllable transistor (T3-T9), a control end of the third controllable transistor (T3) receives low-level transfer signals, a first end of the third controllable transistor (T3) is connected to a first end of the sixth controllable transistor (T6) and a first end of the eighth controllable transistor (T8) and receives the turn-on voltage (VGH), a second end of the third controllable transistor (T3) is connected to a first end of the fourth controllable transistor (T4), a first end of the fifth controllable transistor (T5), the seventh controllable transistor (T7) and the ninth controllable transistor (T9), a second end of the ninth controllable transistor (T9), and a control end of the second controllable transistor (T2); a control end of the fourth controllable transistor (T4) is connected to the second end of the first controllable transistor (T1), a second end of the fourth controllable transistor (T4) is connected to a second end of the fifth controllable transistor (T5), the second end of the second controllable transistor (T2), and the scanning output circuit, and the second end of the fourth controllable transistor (T4) receives the turn-off voltage (VSS); a control end of the fifth controllable transistor (T5) receives high-level scanning signals, a control end of the sixth controllable transistor (T6) receives first clock signals, a second end of the sixth controllable transistor (T6) is connected to a first end of the seventh controllable transistor (T7), a control end of the seventh controllable transistor (T7) receives the second clock signals, a control end of the eighth controllable transistor (T8) receives the third clock signals, a second end of the eighth controllable transistor (T8) is connected to a first end of the ninth controllable transistor (T9), and a control end of the ninth controllable transistor (T9) receives the fourth clock signals.

Wherein the scanning output circuit includes a tenth controllable transistor (T10) through a thirteenth controllable transistor (T13) and a capacitor (C1), a control end of the tenth controllable transistor (T10) is connected to the second end of the first controllable transistor (T1), the first end of the second controllable transistor (T2), and a control end of the eleventh controllable transistor (T11), a first end of the tenth controllable transistor (T10) is connected to a first end of the eleventh controllable transistor (T11) and receives the fourth clock signals, a second end of the tenth controllable transistor (T10) receives current-level transfer signals, a second end of the eleventh controllable transistor (T11) is connected to a scanning signal output end for outputting the current-level transfer signals and a first end of the thirteenth controllable transistor (T13), a control end of the thirteenth controllable transistor (T13) receives the second clock signals, a second end of the thirteenth controllable transistor (T13) is connected to the second end of the twelfth controllable transistor (T12), the second end of the second controllable transistor (T2), the second end of the fifth controllable transistor (T5), and the second end of the fourth controllable transistor (T4), and receives the turn-off voltage (VSS); a control end of the twelfth controllable transistor (T12) is connected to the control end of the second controllable transistor (T2), a first end of the twelfth controllable transistor (T12) is connected to the second end of the eleventh controllable transistor (T11), the first end of the thirteenth controllable transistor (T13), and the scanning signal output end; and the capacitor (C1) connects between the control end of the tenth controllable transistor (T10) and the first end of the twelfth controllable transistor (T12).

Wherein the first through the thirteenth controllable transistors (T1-T13) are N-type IGZO TFTs, and the control ends, the first ends, and the second ends of the first through the thirteenth controllable transistors (T1-T13) respectively corresponds to a gate, a drain, and a source of the N-type IGZO TFTs.

Wherein the level of the second clock signals is opposite to that of the fourth clock signals, and the level of the third clock signals is opposite to that of the first clock signals, a duty cycle ratio of the first to the fourth clock signals (CK1-CK4) is 50%, an overlapped period of two adjacent clock signals is about half of the width of the clock signals, a voltage of the first to the fourth clock signals (CK1-CK4)

is in a range from −8V to 28V, the turn-on voltage (VGH) is 29V, and the turn-off voltage (VSS) is −6V.

Wherein the pull-down control circuit includes a third controllable transistor through a ninth controllable transistor (T3-T9), a control end of the third controllable transistor (T3) receives low-level transfer signals, a first end of the third controllable transistor (T3) is connected to a first end of the sixth controllable transistor (T6) and a first end of the eighth controllable transistor (T8) and receives the turn-on voltage (VGH), a second end of the third controllable transistor (T3) is connected to a first end of the fourth controllable transistor (T4), a first end of the fifth controllable transistor (T5), the seventh controllable transistor (T7) and the ninth controllable transistor (T9), a second end of the ninth controllable transistor (T9), and a control end of the second controllable transistor (T2); a control end of the fourth controllable transistor (T4) is connected to the second end of the first controllable transistor (T1), a second end of the fourth controllable transistor (T4) is connected to a second end of the fifth controllable transistor (T5), the second end of the second controllable transistor (T2), and the scanning output circuit, and the second end of the fourth controllable transistor (T4) receives the turn-off voltage (VSS); a control end of the fifth controllable transistor (T5) receives high-level scanning signals, a control end of the sixth controllable transistor (T6) receives second clock signals, a second end of the sixth controllable transistor (T6) is connected to a first end of the seventh controllable transistor (T7), a control end of the seventh controllable transistor (T7) receives the third clock signals, a control end of the eighth controllable transistor (T8) receives the fourth clock signals, a second end of the eighth controllable transistor (T8) is connected to a first end of the ninth controllable transistor (T9), and a control end of the ninth controllable transistor (T9) receives the first clock signals; wherein the scanning output circuit includes a tenth controllable transistor (T10) through a thirteenth controllable transistor (T13) and a capacitor (C1), a control end of the tenth controllable transistor (T10) is connected to the second end of the first controllable transistor (T1), the first end of the second controllable transistor (T2), and a control end of the eleventh controllable transistor (T11), a first end of the tenth controllable transistor (T10) is connected to a first end of the eleventh controllable transistor (T11) and receives the fourth clock signals, a second end of the tenth controllable transistor (T10) receives current-level transfer signals, a second end of the eleventh controllable transistor (T11) is connected to a scanning signal output end for outputting the current-level transfer signals and a first end of the thirteenth controllable transistor (T13), a control end of the thirteenth controllable transistor (T13) receives the second clock signals, a second end of the thirteenth controllable transistor (T13) is connected to the second end of the twelfth controllable transistor (T12), the second end of the second controllable transistor (T2), the second end of the fifth controllable transistor (T5), and the second end of the fourth controllable transistor (T4), and receives the turn-off voltage (VSS); a control end of the twelfth controllable transistor (T12) is connected to the control end of the second controllable transistor (T2), a first end of the twelfth controllable transistor (T12) is connected to the second end of the eleventh controllable transistor (T11), the first end of the thirteenth controllable transistor (T13), and the scanning signal output end; and the capacitor (C1) connects between the control end of the tenth controllable transistor (T10) and the first end of the twelfth controllable transistor (T12).

Wherein the pull-down control circuit includes a third controllable transistor through a ninth controllable transistor (T3-T9), a control end of the third controllable transistor (T3) receives low-level transfer signals, a first end of the third controllable transistor (T3) is connected to a first end of the sixth controllable transistor (T6) and a first end of the eighth controllable transistor (T8) and receives the turn-on voltage (VGH), a second end of the third controllable transistor (T3) is connected to a first end of the fourth controllable transistor (T4), a first end of the fifth controllable transistor (T5), the seventh controllable transistor (T7) and the ninth controllable transistor (T9), a second end of the ninth controllable transistor (T9), and a control end of the second controllable transistor (T2); a control end of the fourth controllable transistor (T4) is connected to the second end of the first controllable transistor (T1), a second end of the fourth controllable transistor (T4) is connected to a second end of the fifth controllable transistor (T5), the second end of the second controllable transistor (T2), and the scanning output circuit, and the second end of the fourth controllable transistor (T4) receives the turn-off voltage (VSS); a control end of the fifth controllable transistor (T5) receives high-level scanning signals, a control end of the sixth controllable transistor (T6) receives third clock signals, a second end of the sixth controllable transistor (T6) is connected to a first end of the seventh controllable transistor (T7), a control end of the seventh controllable transistor (T7) receives the fourth clock signals, a control end of the eighth controllable transistor (T8) receives the first clock signals, a second end of the eighth controllable transistor (T8) is connected to a first end of the ninth controllable transistor (T9), and a control end of the ninth controllable transistor (T9) receives the second clock signals; wherein the scanning output circuit includes a tenth controllable transistor (T10) through a thirteenth controllable transistor (T13) and a capacitor (C1), a control end of the tenth controllable transistor (T10) is connected to the second end of the first controllable transistor (T1), the first end of the second controllable transistor (T2), and a control end of the eleventh controllable transistor (T11), a first end of the tenth controllable transistor (T10) is connected to a first end of the eleventh controllable transistor (T11) and receives the fourth clock signals, a second end of the tenth controllable transistor (T10) receives current-level transfer signals, a second end of the eleventh controllable transistor (T11) is connected to a scanning signal output end for outputting the current-level transfer signals and a first end of the thirteenth controllable transistor (T13), a control end of the thirteenth controllable transistor (T13) receives the second clock signals, a second end of the thirteenth controllable transistor (T13) is connected to the second end of the twelfth controllable transistor (T12), the second end of the second controllable transistor (T2), the second end of the fifth controllable transistor (T5), and the second end of the fourth controllable transistor (T4), and receives the turn-off voltage (VSS); a control end of the twelfth controllable transistor (T12) is connected to the control end of the second controllable transistor (T2), a first end of the twelfth controllable transistor (T12) is connected to the second end of the eleventh controllable transistor (T11), the first end of the thirteenth controllable transistor (T13), and the scanning signal output end; and the capacitor (C1) connects between the control end of the tenth controllable transistor (T10) and the first end of the twelfth controllable transistor (T12).

Wherein the pull-down control circuit includes a third controllable transistor through a ninth controllable transistor (T3-T9), a control end of the third controllable transistor (T3) receives low-level transfer signals, a first end of the third controllable transistor (T3) is connected to a first end of the sixth controllable transistor (T6) and a first end of the eighth controllable transistor (T8) and receives the turn-on voltage (VGH), a second end of the third controllable transistor (T3) is connected to a first end of the fourth controllable transistor (T4), a first end of the fifth controllable transistor (T5), the seventh controllable transistor (T7) and the ninth controllable transistor (T9), a second end of the ninth controllable transistor (T9), and a control end of the second controllable transistor (T2); a control end of the fourth controllable transistor (T4) is connected to the second end of the first controllable transistor (T1), a second end of the fourth controllable transistor (T4) is connected to a second end of the fifth controllable transistor (T5), the second end of the second controllable transistor (T2), and the scanning output circuit, and the second end of the fourth controllable transistor (T4) receives the turn-off voltage (VSS); a control end of the fifth controllable transistor (T5) receives high-level scanning signals, a control end of the sixth controllable transistor (T6) receives fourth clock signals, a second end of the sixth controllable transistor (T6) is connected to a first end of the seventh controllable transistor (T7), a control end of the seventh controllable transistor (T7) receives the first clock signals, a control end of the eighth controllable transistor (T8) receives the first clock signals, a second end of the eighth controllable transistor (T8) is connected to a second end of the ninth controllable transistor (T9), and a control end of the ninth controllable transistor (T9) receives the third clock signals; wherein the scanning output circuit includes a tenth controllable transistor (T10) through a thirteenth controllable transistor (T13) and a capacitor (C1), a control end of the tenth controllable transistor (T10) is connected to the second end of the first controllable transistor (T1), the first end of the second controllable transistor (T2), and a control end of the eleventh controllable transistor (T11), a first end of the tenth controllable transistor (T10) is connected to a first end of the eleventh controllable transistor (T11) and receives the fourth clock signals, a second end of the tenth controllable transistor (T10) receives current-level transfer signals, a second end of the eleventh controllable transistor (T11) is connected to a scanning signal output end for outputting the current-level transfer signals and a first end of the thirteenth controllable transistor (T13), a control end of the thirteenth controllable transistor (T13) receives the second clock signals, a second end of the thirteenth controllable transistor (T13) is connected to the second end of the twelfth controllable transistor (T12), the second end of the second controllable transistor (T2), the second end of the fifth controllable transistor (T5), and the second end of the fourth controllable transistor (T4), and receives the turn-off voltage (VSS); a control end of the twelfth controllable transistor (T12) is connected to the control end of the second controllable transistor (T2), a first end of the twelfth controllable transistor (T12) is connected to the second end of the eleventh controllable transistor (T11), the first end of the thirteenth controllable transistor (T13), and the scanning signal output end; and the capacitor (C1) connects between the control end of the tenth controllable transistor (T10) and the first end of the twelfth controllable transistor (T12).

In view of the above, by configuring the IGZO TFTs in the above pull-up control circuit, the pull-down control circuit, and the scanning output circuit, the number of the power supply and the number of TFTs are reduced so as to simplify the circuit and to reduce the power consumption.

DETAILED DESCRIPTION OF THE EMBODIMENTS

Embodiments of the invention will now be described more fully hereinafter with reference to the accompanying drawings, in which embodiments of the invention are shown.

Figure 1:
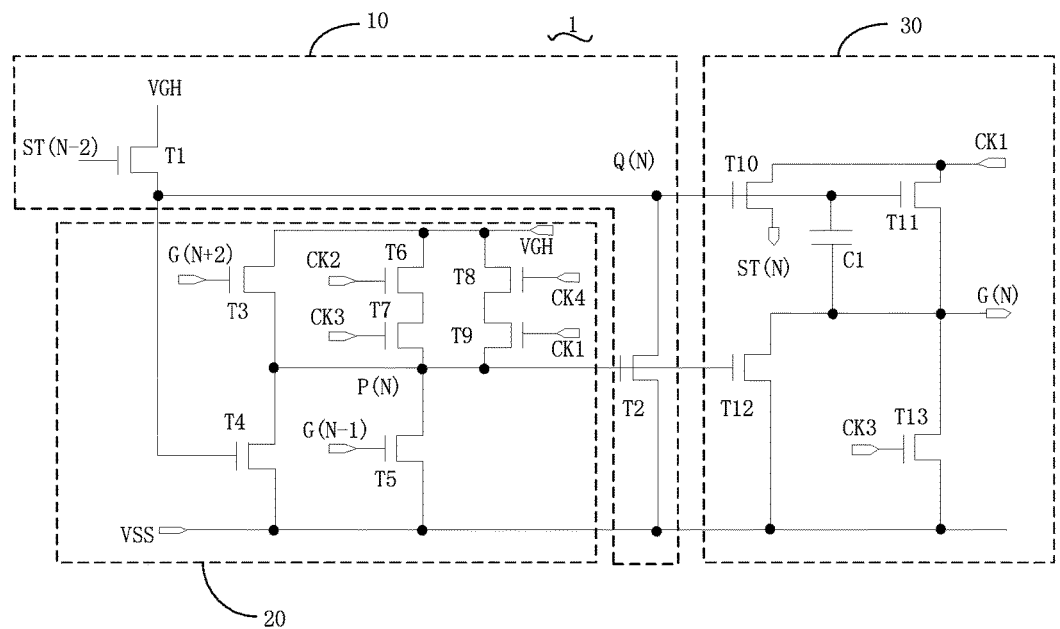
FIG. 1 is a circuit diagram of the scanning driving circuit in accordance with a first embodiment.
Figure 2:
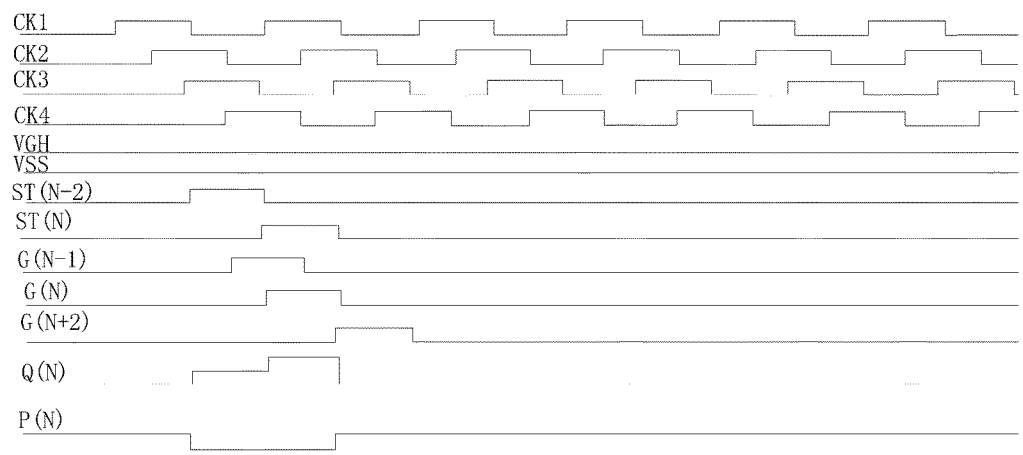
FIG. 2 is a wave diagram of the scanning driving circuit in accordance with one embodiment.

FIGS. 1 and 2 are circuit diagrams of the scanning driving circuit 1 in accordance with one embodiment. The scanning driving circuit 1 includes: a pull-up control circuit 10 for pulling up a level of a pull-up control signal point to be a high level or for pulling down the level of the pull-up control signal point to be a low level; a pull-down control circuit 20 for pulling down the level of a pull-down control signal point to be the high level or for pulling down the level of the pull-down control signal point to be the low level, and the pull-down control circuit 20 connects to the pull-up control circuit 10; and a scanning output circuit 30 connecting to the pull-up control circuit 10 and the pull-down control circuit 20, and the scanning output circuit 30 is configured to output the scanning driving signals of the high level or of the low level in accordance with the level of the pull-up control signal point or the level of the pull-down control signal point.

The pull-up control circuit 10 includes a first controllable transistor (T1) and a second controllable transistor (T2), a control end of the first controllable transistor (T1) receives high-level transfer signals, a first end of the first controllable transistor (T1) receives a turn-on voltage (VGH), a second end of the first controllable transistor (T1) connects to a first end of the second controllable transistor (T2), the pull-down control circuit 20, and the scanning output circuit 30; a control end of the second controllable transistor (T2) connects to the pull-down control circuit 20 and the scanning output circuit 30, and a second end of the second controllable transistor (T2) connects to the pull-down control circuit 20 and the scanning output circuit 30 to receive a turn-off voltage (VSS).

The pull-down control circuit 20 includes a third controllable transistor through a ninth controllable transistor (T3-T9), a control end of the third controllable transistor (T3) receives low-level transfer signals, a first end of the third controllable transistor (T3) connects to a first end of the sixth controllable transistor (T6) and a first end of the eighth controllable transistor (T8) and receives the turn-on voltage (VGH), a second end of the third controllable transistor (T3) connects to a first end of the fourth controllable transistor (T4), a first end of the fifth controllable transistor (T5), the seventh controllable transistor (T7) and the ninth controllable transistor (T9), a second end of the ninth controllable transistor (T9), and a control end of the second controllable transistor (T2); a control end of the fourth controllable transistor (T4) connects to the second end of the first controllable transistor (T1), a second end of the fourth controllable transistor (T4) connects to a second end of the fifth controllable transistor (T5), the second end of the second controllable transistor (T2), and the scanning output circuit 30, and the second end of the fourth controllable transistor (T4) receives the turn-off voltage (VSS); a control end of the fifth controllable transistor (T5) receives high-level scanning signals, a control end of the sixth controllable transistor (T6) receives first clock signals (CK2), a second end of the sixth controllable transistor (T6) connects to a first end of the seventh controllable transistor (T7), a control end of the seventh controllable transistor (T7) receives the second clock signals (CK3), a control end of the eighth controllable transistor (T8) receives the third clock signals (CK4), a second end of the eighth controllable transistor (T8) connects to a first end of the ninth controllable transistor (T9), and a control end of the ninth controllable transistor (T9) receives the fourth clock signals (CK1).

The scanning output circuit 30 includes a tenth controllable transistor (T10) through a thirteenth controllable transistor (T13) and a capacitor (C1), a control end of the tenth controllable transistor (T10) connects to the second end of the first controllable transistor (T1), the first end of the second controllable transistor (T2), and a control end of the eleventh controllable transistor (T11), a first end of the tenth controllable transistor (T10) connects to a first end of the eleventh controllable transistor (T11) and receives the fourth clock signals (CK1), a second end of the tenth controllable transistor (T10) receives current-level transfer signals, a second end of the eleventh controllable transistor (T11) connects to a scanning signal output end for outputting the current-level transfer signals and a first end of the thirteenth controllable transistor (T13), a control end of the thirteenth controllable transistor (T13) receives the second clock signals (CK3), a second end of the thirteenth controllable transistor (T13) connects to the second end of the twelfth controllable transistor (T12), the second end of the second controllable transistor (T2), the second end of the fifth controllable transistor (T5), and the second end of the fourth controllable transistor (T4), and receives the turn-off voltage (VSS); a control end of the twelfth controllable transistor (T12) connects to the control end of the second controllable transistor (T2), a first end of the twelfth controllable transistor (T12) connects to the second end of the eleventh controllable transistor (T11), the first end of the thirteenth controllable transistor (T13), and the scanning signal output end; and the capacitor (C1) connects between the control end of the tenth controllable transistor (T10) and the first end of the twelfth controllable transistor (T12).

In the embodiment, the first through the thirteenth controllable transistors (T1-T13) are N-type IGZO TFTs, and the control ends, the first ends, and the second ends of the first through the thirteenth controllable transistors (T1-T13) respectively corresponds to the gate, the drain, and the source of the N-type IGZO TFTs. In other embodiments, the transistors of other types may be adopted.

In the embodiment, the level of the second clock signals (CK2) is opposite to that of the fourth clock signals (CK4), and the level of the third clock signals (CK3) is opposite to that of the first clock signals (CK1). The duty cycle ratio of the first to the fourth clock signals (CK1-CK4) is 50%. An overlapped period of two adjacent clock signals is about half of the width of the clock signals. The voltage of the first to the fourth clock signals (CK1-CK4) is in a range from −8V to 28V. The turn-on voltage (VGH) is 29V, and the turn-off voltage (VSS) is −6V.

The high-level transfer signals are ST(N−2), the current-level transfer signals are ST (N), the current-level scanning signals are G(N), the high-level scanning signals are G(N−1), the low-level transfer signals are G(N+2), the first clock signals are CK2, the second clock signals are CK3, the third clock signals are CK4, and the fourth clock signals are CK1, the turn-on voltage is denoted as VGH, and the turn-off voltage (VSS) is denoted as VSS.

The operational principle of the scanning driving circuit will be described hereinafter, wherein the scanning signals G(5) are taken as one example.

Wherein the current-level scanning signals G(N)=G(5), the high-level transfer signals ST(N−2)=ST(3), the current-level transfer signals ST(N)=ST(3), the high-level scanning signals G(N−1)=G(4), the low-level scanning signals G(N+2)=G(7), the pull-up control signal point Q(N)=Q(5), and a pull-down control signal point P(N)=P(5).

When the high-level transfer signals ST(3) is the high level, the first controllable transistor (T1) is turned on, the pull-up control signal point Q(5) is the high level, the tenth controllable transistor (T10) and the eleventh controllable transistor (T11) are turned on. At this moment, the fourth clock signals (CK1) are at the high level, and the current-level scanning signals G(5) and the current-level transfer signals ST(5) are at the high level. The fourth controllable transistor (T4) is turned on and the turn-off voltage (VSS) pulls down the pull-down control signal point P(5) to the low level, the second controllable transistor (T2) and the twelfth controllable transistor (T12) are turned off, and the current-level scanning signals G(5) are at the high level.

When the high-level transfer signals ST(3) are at the low level, the first controllable transistor (T1) is turned off, The high level of the pull-up control signal point Q(5) may be higher due to the coupling effect of the capacitor. The tenth controllable transistor (T10) and the eleventh controllable transistor (T11) are turned on. At this moment, the fourth clock signals (CK1) are at the high level, and the current-level scanning signals G(5) and the current-level transfer signals ST(5) are at the high level, and the fourth controllable transistor (T4) is turned on. Thus, the turn-off voltage (VSS) pulls down the pull-down control signal point P(5) to be at the low level. The second controllable transistor (T2) and the twelfth controllable transistor (T12) are turned off, and the level of the pull-up control signal point Q(5) is not affected. In addition, as the high-level scanning signals G(4) are at the high level, the fifth controllable transistor (T5) is turned on, the turn-off voltage (VSS) maintains the low level of the pull-down control signal point P(5), the second controllable transistor (T2) and the twelfth controllable transistor (T12) are turned off, and the current-level scanning signals G(5) are at the high level.

When the fourth clock signals (CK1) are at the low level, the second clock signals (CK3) are at the high level, the thirteenth controllable transistor (T13) is turned on, the turn-off voltage (VSS) pulls down the current-level scanning signals G(5) to be at the low level. At the same time, the low-level scanning signals G(7) are at the high level, and the third controllable transistor (T3) is turned on, the turn-on voltage (VGH) cause the pull-down control signal point to be at the high level, the second controllable transistor (T2) and the twelfth controllable transistor (T12) are turned on, the turn-off voltage (VSS) pulls down the pull-up control signal point Q(5) and the current-level scanning signals G(5) to be at the low level.

The sixth controllable transistor (T6) is controlled by the first clock signals (CK2), the seventh controllable transistor (T7) is controlled by the second clock signals (CK3), the eighth controllable transistor (T8) is controlled by the third clock signals (CK4), the ninth controllable transistor (T9) is controlled by the fourth clock signals (CK1), and thus the pull-down control signal point P(5) is at the high level within one frame, which ensures the low level of the current-level scanning signals G(5).

The control end of the thirteenth controllable transistor (T13) receives the second clock signals (CK3) having the level opposite to that of the fourth clock signals (CK1) such that the turned-on second clock signals (CK3) ensures the low level of the current-level scanning signals G(5).

Figure 3:
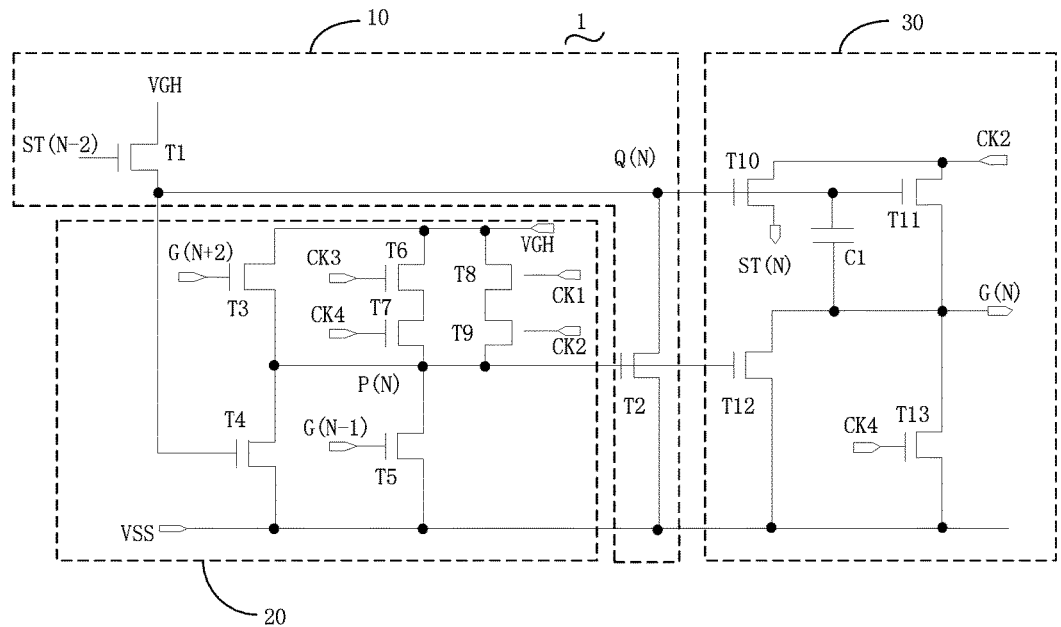
FIG. 3 is a circuit diagram of the scanning driving circuit in accordance with a second embodiment.

FIG. 3 is a circuit diagram of the scanning driving circuit in accordance with a second embodiment. The difference between the first embodiment and the second embodiment resides in that: the control end of the sixth controllable transistor (T6) of the pull-down control circuit 20 receives the second clock signals (CK3), the control end of the seventh controllable transistor (T7) receives the third clock signals (CK4), the control end of the eighth controllable transistor (T8) receives the fourth clock signals (CK1), and the control end of the ninth controllable transistor (T9) receives the first clock signals (CK2).

The first end of the tenth controllable transistor (T10) of the scanning output circuit 30 connects to the first end of the eleventh controllable transistor (T11), and receives the first clock signals (CK2); the control end of the thirteenth controllable transistor (T13) receives the third clock signals (CK4).

Figure 4:
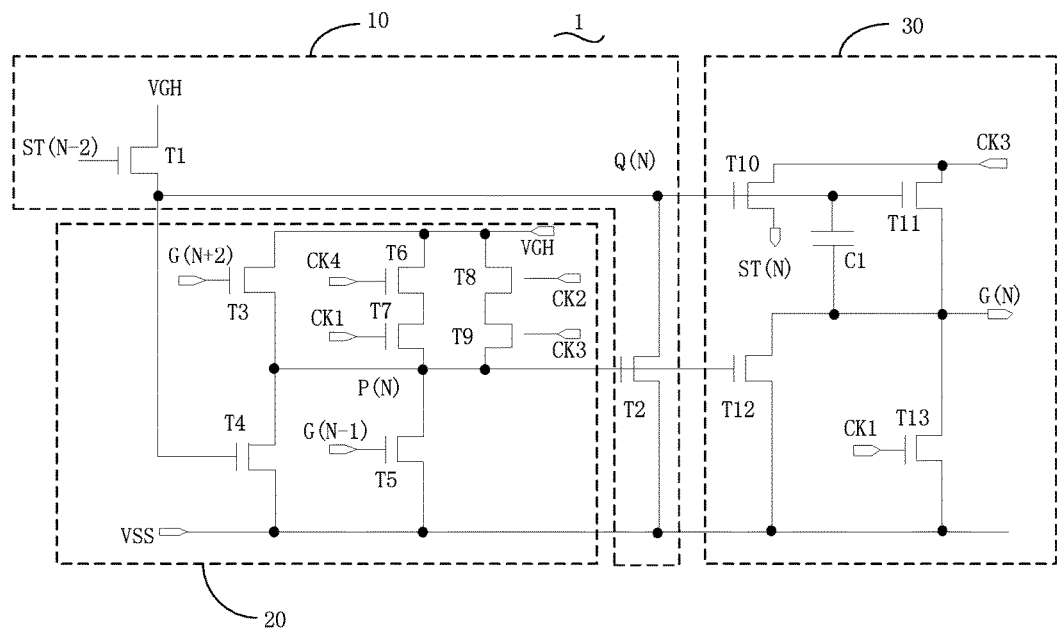
FIG. 4 is a circuit diagram of the scanning driving circuit in accordance with a third embodiment.

FIG. 4 is a circuit diagram of the scanning driving circuit in accordance with a third embodiment. The difference between the first embodiment and the third embodiment resides in that: the control end of the sixth controllable transistor (T6) of the pull-down control circuit 20 receives the third clock signals (CK4), the control end of the seventh controllable transistor (T7) receives the fourth clock signals (CK1), the control end of the eighth controllable transistor (T8) receives the first clock signals (CK2), and the control end of the ninth controllable transistor (T9) receives the second clock signals (CK3).

The first end of the tenth controllable transistor (T10) of the scanning output circuit 30 connects to the first end of the eleventh controllable transistor (T11), and receives the second clock signals (CK3); the control end of the thirteenth controllable transistor (T13) receives the fourth clock signals (CK1).

Figure 5:
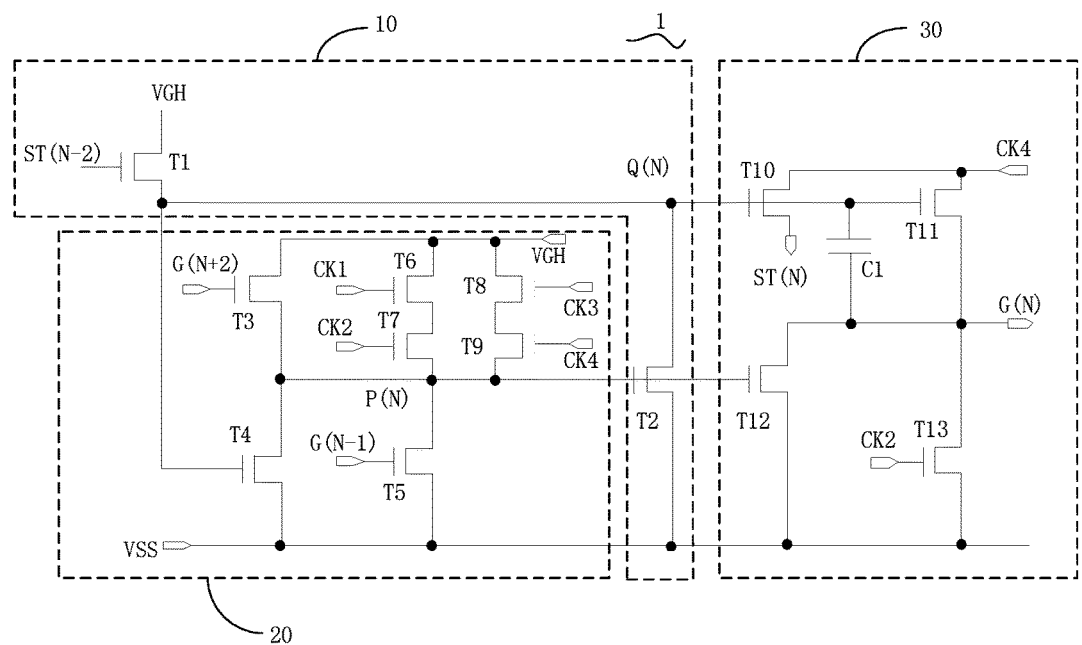
FIG. 5 is a circuit diagram of the scanning driving circuit in accordance with a fourth embodiment.

FIG. 5 is a circuit diagram of the scanning driving circuit in accordance with a fourth embodiment. The difference between the first embodiment and the fourth embodiment resides in that: the control end of the sixth controllable transistor (T6) of the pull-down control circuit 20 receives the fourth clock signals (CK1), the control end of the seventh controllable transistor (T7) receives the first clock signals (CK2), the control end of the eighth controllable transistor (T8) receives the second clock signals (CK3), and the control end of the ninth controllable transistor (T9) receives the third clock signals (CK4).

The first end of the tenth controllable transistor (T10) of the scanning output circuit 30 connects to the first end of the eleventh controllable transistor (T11), and receives the third clock signals (CK4), and the control end of the thirteenth controllable transistor (T13) receives the first clock signals (CK2).

The operational principle of the scanning driving circuit in the second to the fourth embodiments are the same with that of the scanning driving circuit in the first embodiment, and the descriptions are omitted hereinafter.

Figure 6:
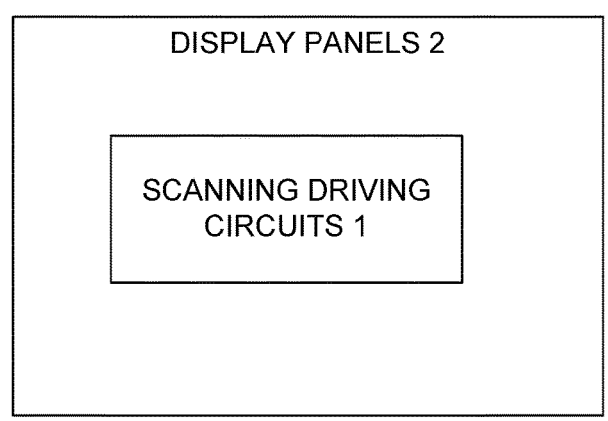
FIG. 6 is a schematic view of the display panel in accordance with one embodiment.

FIG. 6 is a schematic view of the display panel in accordance with one embodiment. The display panel 2 includes the scanning driving circuit 1, and the other components and functions of the display panel 2 may be the same with the conventional ones and thus the descriptions are omitted hereinafter. The display panel 2 may be a liquid crystal device (LCD) and an organic light emitting diode (OLED).

In view of the above, by configuring the IGZO TFTs in the above pull-up control circuit, the pull-down control circuit, and the scanning output circuit, the number of the power supply and the number of TFTs are reduced so as to simplify the circuit and to reduce the power consumption.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A scanning driving circuit, comprising:
a pull-up control circuit configured to pull up a level of a pull-up control signal point to be a high level;
a pull-down control circuit configured to pull down a level of the pull-down control signal point to be a low level, and connected to the pull-up control circuit;
a scanning output circuit connected to the pull-up control circuit and the pull-down control circuit, and configured to output scanning driving signals of the high level or of the low level in accordance with the level of the pull-up control signal point or the level of the pull-down control signal point;
wherein the pull-up control circuit comprises a first controllable transistor and a second controllable transistor, a control end of the first controllable transistor receives high-level transfer signals, a first end of the first controllable transistor receives a turn-on voltage, a second end of the first controllable transistor is connected to a first end of the second controllable transistor, the pull-down control circuit, and the scanning output circuit;
a control end of the second controllable transistor is connected to the pull-down control circuit and the scanning output, and a second end of the second controllable transistor is connected to the pull-down control circuit and the scanning output to receive a turn-off voltage;
the pull-down control circuit comprises a third controllable transistor through a ninth controllable transistor, wherein a control end of the third controllable transistor receives low-level transfer signals, a first end of the third controllable transistor is connected to a first end of the sixth controllable transistor and a first end of the eighth controllable transistor and receives the turn-on voltage, a second end of the third controllable transistor is connected to a first end of the fourth controllable transistor, a first end of the fifth controllable transistor, the seventh controllable transistor and the ninth controllable transistor, a second end of the ninth controllable transistor, and a control end of the second controllable transistor; a control end of the fourth controllable transistor is connected to the second end of the first controllable transistor, a second end of the fourth controllable transistor is connected to a second end of the fifth controllable transistor, the second end of the second controllable transistor, and the scanning output circuit, and the second end of the fourth controllable transistor receives the turn-off voltage; a control end of the fifth controllable transistor receives high-level scanning signals, a control end of the sixth controllable transistor receives first clock signals, a second end of the sixth controllable transistor is connected to a first end of the seventh controllable transistor, a control end of the seventh controllable transistor receives the second clock signals, a control end of the eighth controllable transistor receives the third clock signals, a second end of the eighth controllable transistor is connected to a first end of the ninth controllable transistor, and a control end of the ninth controllable transistor receives the fourth clock signals;

the scanning output circuit comprises a tenth controllable transistor through a thirteenth controllable transistor and a capacitor, wherein a control end of the tenth controllable transistor is connected to the second end of the first controllable transistor, the first end of the second controllable transistor, and a control end of the eleventh controllable transistor, a first end of the tenth controllable transistor is connected to a first end of the eleventh controllable transistor and receives the fourth clock signals, a second end of the tenth controllable transistor receives current-level transfer signals, a second end of the eleventh controllable transistor is connected to a scanning signal output end for outputting the current-level transfer signals and a first end of the thirteenth controllable transistor, a control end of the thirteenth controllable transistor receives the second clock signals, a second end of the thirteenth controllable transistor is connected to the second end of the twelfth controllable transistor, the second end of the second controllable transistor, the second end of the fifth controllable transistor, and the second end of the fourth controllable transistor, and receives the turn-off voltage; a control end of the twelfth controllable transistor is connected to the control end of the second controllable transistor, a first end of the twelfth controllable transistor is connected to the second end of the eleventh controllable transistor, the first end of the thirteenth controllable transistor, and the scanning signal output end; and the capacitor connects between the control end of the tenth controllable transistor and the first end of the twelfth controllable transistor;

the first through the thirteenth controllable transistors are N-type IGZO TFTs, and the control ends, the first ends, and the second ends of the first through the thirteenth controllable transistors respectively corresponds to a gate, a drain, and a source of the N-type IGZO TFTs;

a level of the second clock signals is opposite to that of the fourth clock signals, and a level of the third clock signals is opposite to that of the first clock signals, a duty cycle ratio of the first to the fourth clock signals is 50%, an overlapped period of two adjacent clock signals is about half of the width of the clock signals, a voltage of the first to the fourth clock signals is in a range from −8V to 28V, the turn-on voltage is 29V, and the turn-off voltage is −6V.

2. The scanning driving circuit as claimed in claim 1, wherein the scanning output circuit comprises a tenth controllable transistor through a thirteenth controllable transistor and a capacitor, a control end of the tenth controllable transistor is connected to the second end of the first controllable transistor, the first end of the second controllable transistor, and a control end of the eleventh controllable transistor, a first end of the tenth controllable transistor is connected to a first end of the eleventh controllable transistor and receives the fourth clock signals, a second end of the tenth controllable transistor receives current-level transfer signals, a second end of the eleventh controllable transistor is connected to a scanning signal output end for outputting the current-level transfer signals and a first end of the thirteenth controllable transistor, a control end of the thirteenth controllable transistor receives the second clock signals, a second end of the thirteenth controllable transistor is connected to the second end of the twelfth controllable transistor, the second end of the second controllable transistor, the second end of the fifth controllable transistor, and the second end of the fourth controllable transistor, and receives the turn-off voltage; a control end of the twelfth controllable transistor is connected to the control end of the second controllable transistor, a first end of the twelfth controllable transistor is connected to the second end of the eleventh controllable transistor, the first end of the thirteenth controllable transistor, and the scanning signal output end; and the capacitor connects between the control end of the tenth controllable transistor and the first end of the twelfth controllable transistor.

3. The scanning driving circuit as claimed in claim 2, wherein the first through the thirteenth controllable transistors are N-type IGZO TFTs, and the control ends, the first ends, and the second ends of the first through the thirteenth controllable transistors respectively corresponds to a gate, a drain, and a source of the N-type IGZO TFTs.

4. The scanning driving circuit as claimed in claim 2, wherein a level of the second clock signals is opposite to that of the fourth clock signals, and a level of the third clock signals is opposite to that of the first clock signals, a duty cycle ratio of the first to the fourth clock signals is 50%, an overlapped period of two adjacent clock signals is about half of the width of the clock signals, a voltage of the first to the fourth clock signals is in a range from −8V to 28V, the turn-on voltage is 29V, and the turn-off voltage is −6V.

5. A scanning driving circuit, comprising:
a pull-up control circuit configured to pull up a level of a pull-up control signal point to be a high level;
a pull-down control circuit configured to pull down a level of the pull-down control signal point to be a low level, and connected to the pull-up control circuit; and
a scanning output circuit connected to the pull-up control circuit and the pull-down control circuit, and configured to output scanning driving signals of the high level or of the low level in accordance with the level of the pull-up control signal point or the level of the pull-down control signal point;
wherein the pull-up control circuit comprises a first controllable transistor and a second controllable transistor, a control end of the first controllable transistor receives high-level transfer signals, a first end of the first controllable transistor receives a turn-on voltage, a second end of the first controllable transistor is connected to a first end of the second controllable transistor, the pull-down control circuit, and the scanning output circuit; and
a control end of the second controllable transistor is connected to the pull-down control circuit and the scanning output, and a second end of the second controllable transistor is connected to the pull-down control circuit and the scanning output to receive a turn-off voltage;
wherein the pull-down control circuit comprises a third controllable transistor through a ninth controllable transistor, a control end of the third controllable transistor receives low-level transfer signals, a first end of the third controllable transistor is connected to a first end of the sixth controllable transistor and a first end of the eighth controllable transistor and receives the turn-on voltage, a second end of the third controllable transistor is connected to a first end of the fourth controllable transistor, a first end of the fifth controllable transistor, the seventh controllable transistor and the ninth controllable transistor, a second end of the ninth controllable transistor, and a control end of the second controllable transistor; a control end of the fourth controllable transistor is connected to the second end of the first controllable transistor, a second end of the fourth controllable transistor is connected to a second end of the fifth controllable transistor, the second end of the second controllable transistor, and the scanning output circuit, and the second end of the fourth controllable transistor receives the turn-off voltage; a control end of the fifth controllable transistor receives high-level scanning signals, a control end of the sixth controllable transistor receives first clock signals, a second end of the sixth controllable transistor is connected to a first end of the seventh controllable transistor, a control end of the seventh controllable transistor receives the second clock signals, a control end of the eighth controllable transistor receives the third clock signals, a second end of the eighth controllable transistor is connected to a first end of the ninth controllable transistor, and a control end of the ninth controllable transistor receives the fourth clock signals.

6. The scanning driving circuit as claimed in claim 5, wherein the pull-down control circuit comprises a third controllable transistor through a ninth controllable transistor, a control end of the third controllable transistor receives low-level transfer signals, a first end of the third controllable transistor is connected to a first end of the sixth controllable transistor and a first end of the eighth controllable transistor and receives the turn-on voltage, a second end of the third controllable transistor is connected to a first end of the fourth controllable transistor, a first end of the fifth controllable transistor, the seventh controllable transistor and the ninth controllable transistor, a second end of the ninth controllable transistor, and a control end of the second controllable transistor; a control end of the fourth controllable transistor is connected to the second end of the first controllable transistor, a second end of the fourth controllable transistor is connected to a second end of the fifth controllable transistor, the second end of the second controllable transistor, and the scanning output circuit, and the second end of the fourth controllable transistor receives the turn-off voltage; a control end of the fifth controllable transistor receives high-level scanning signals, a control end of the sixth controllable transistor receives second clock signals, a second end of the sixth controllable transistor is connected to a first end of the seventh controllable transistor, a control end of the seventh controllable transistor receives the third clock signals, a control end of the eighth controllable transistor receives the fourth clock signals, a second end of the eighth controllable transistor is connected to a first end of the ninth controllable transistor, and a control end of the ninth controllable transistor receives the first clock signals;

wherein the scanning output circuit comprises a tenth controllable transistor through a thirteenth controllable transistor and a capacitor, a control end of the tenth controllable transistor is connected to the second end of the first controllable transistor, the first end of the second controllable transistor, and a control end of the eleventh controllable transistor, a first end of the tenth controllable transistor is connected to a first end of the eleventh controllable transistor and receives the fourth clock signals, a second end of the tenth controllable transistor receives current-level transfer signals, a second end of the eleventh controllable transistor is connected to a scanning signal output end for outputting the current-level transfer signals and a first end of the thirteenth controllable transistor, a control end of the thirteenth controllable transistor receives the second clock signals, a second end of the thirteenth controllable transistor is connected to the second end of the twelfth controllable transistor, the second end of the second controllable transistor, the second end of the fifth controllable transistor, and the second end of the fourth controllable transistor, and receives the turn-off voltage; a control end of the twelfth controllable transistor is connected to the control end of the second controllable transistor, a first end of the twelfth controllable transistor is connected to the second end of the eleventh controllable transistor, the first end of the thirteenth controllable transistor, and the scanning signal output end; and the capacitor connects between the control end of the tenth controllable transistor and the first end of the twelfth controllable transistor.

7. The scanning driving circuit as claimed in claim 5, wherein the pull-down control circuit comprises a third controllable transistor through a ninth controllable transistor, a control end of the third controllable transistor receives low-level transfer signals, a first end of the third controllable transistor is connected to a first end of the sixth controllable transistor and a first end of the eighth controllable transistor and receives the turn-on voltage, a second end of the third controllable transistor is connected to a first end of the fourth controllable transistor, a first end of the fifth controllable transistor, the seventh controllable transistor and the ninth controllable transistor, a second end of the ninth controllable transistor, and a control end of the second controllable transistor; a control end of the fourth controllable transistor is connected to the second end of the first controllable transistor, a second end of the fourth controllable transistor is connected to a second end of the fifth controllable transistor, the second end of the second controllable transistor, and the scanning output circuit, and the second end of the fourth controllable transistor receives the turn-off voltage; a control end of the fifth controllable transistor receives high-level scanning signals, a control end of the sixth controllable transistor receives third clock signals, a second end of the sixth controllable transistor is connected to a first end of the seventh controllable transistor, a control end of the seventh controllable transistor receives the fourth clock signals, a control end of the eighth controllable transistor receives the first clock signals, a second end of the eighth controllable transistor is connected to a first end of the ninth controllable transistor, and a control end of the ninth controllable transistor receives the second clock signals;

wherein the scanning output circuit comprises a tenth controllable transistor through a thirteenth controllable transistor and a capacitor, a control end of the tenth controllable transistor is connected to the second end of the first controllable transistor, the first end of the second controllable transistor, and a control end of the eleventh controllable transistor, a first end of the tenth controllable transistor is connected to a first end of the eleventh controllable transistor and receives the fourth clock signals, a second end of the tenth controllable transistor receives current-level transfer signals, a second end of the eleventh controllable transistor is connected to a scanning signal output end for outputting the current-level transfer signals and a first end of the thirteenth controllable transistor, a control end of the thirteenth controllable transistor receives the second clock signals, a second end of the thirteenth controllable transistor is connected to the second end of the twelfth controllable transistor, the second end of the second controllable transistor, the second end of the fifth controllable transistor, and the second end of the fourth controllable transistor, and receives the turn-off voltage; a control end of the twelfth controllable transistor is connected to the control end of the second controllable transistor, a first end of the twelfth controllable transistor is connected to the second end of the eleventh controllable transistor, the first end of the thirteenth controllable transistor, and the scanning signal output end; and the capacitor connects between the control end of the tenth controllable transistor and the first end of the twelfth controllable transistor.

8. The scanning driving circuit as claimed in claim 5, wherein the pull-down control circuit comprises a third controllable transistor through a ninth controllable transistor, a control end of the third controllable transistor receives low-level transfer signals, a first end of the third controllable transistor is connected to a first end of the sixth controllable transistor and a first end of the eighth controllable transistor and receives the turn-on voltage, a second end of the third controllable transistor is connected to a first end of the fourth controllable transistor, a first end of the fifth controllable transistor, the seventh controllable transistor and the ninth controllable transistor, a second end of the ninth controllable transistor, and a control end of the second controllable transistor; a control end of the fourth controllable transistor is connected to the second end of the first controllable transistor, a second end of the fourth controllable transistor is connected to a second end of the fifth controllable transistor, the second end of the second controllable transistor, and the scanning output circuit, and the second end of the fourth controllable transistor receives the turn-off voltage; a control end of the fifth controllable transistor receives high-level scanning signals, a control end of the sixth controllable transistor receives fourth clock signals, a second end of the sixth controllable transistor is connected to a first end of the seventh controllable transistor, a control end of the seventh controllable transistor receives the first clock signals, a control end of the eighth controllable transistor receives the first clock signals, a second end of the eighth controllable transistor is connected to a second end of the ninth controllable transistor, and a control end of the ninth controllable transistor receives the third clock signals;

wherein the scanning output circuit comprises a tenth controllable transistor through a thirteenth controllable transistor and a capacitor, a control end of the tenth controllable transistor is connected to the second end of the first controllable transistor, the first end of the second controllable transistor, and a control end of the eleventh controllable transistor, a first end of the tenth controllable transistor is connected to a first end of the eleventh controllable transistor and receives the fourth clock signals, a second end of the tenth controllable transistor receives current-level transfer signals, a second end of the eleventh controllable transistor is connected to a scanning signal output end for outputting the current-level transfer signals and a first end of the thirteenth controllable transistor, a control end of the thirteenth controllable transistor receives the second clock signals, a second end of the thirteenth controllable transistor is connected to the second end of the twelfth controllable transistor, the second end of the second controllable transistor, the second end of the fifth controllable transistor, and the second end of the fourth controllable transistor, and receives the turn-off voltage; a control end of the twelfth controllable transistor is connected to the control end of the second controllable transistor, a first end of the twelfth controllable transistor is connected to the second end of the eleventh controllable transistor, the first end of the thirteenth controllable transistor, and the scanning signal output end; and the capacitor connects between the control end of the tenth controllable transistor and the first end of the twelfth controllable transistor.

9. A display panel, comprising:
a scanning driving circuit comprises:
a pull-up control circuit configured to pull up a level of a pull-up control signal point to be a high level;
a pull-down control circuit configured to pull down a level of the pull-down control signal point to be a low level, and connected to the pull-up control circuit; and
a scanning output circuit connected to the pull-up control circuit and the pull-down control circuit, and the scanning output circuit is configured to output scanning driving signals of the high level or of the low level in accordance with the level of the pull-up control signal point or the level of the pull-down control signal point;
wherein the pull-up control circuit comprises a first controllable transistor and a second controllable transistor, a control end of the first controllable transistor receives high-level transfer signals, a first end of the first controllable transistor receives a turn-on voltage, a second end of the first controllable transistor is connected to a first end of the second controllable transistor, the pull-down control circuit, and the scanning output circuit; and
a control end of the second controllable transistor is connected to the pull-down control circuit and the scanning output, and a second end of the second controllable transistor is connected to the pull-down control circuit and the scanning output to receive a turn-off voltage;
wherein the pull-down control circuit comprises a third controllable transistor through a ninth controllable transistor, a control end of the third controllable transistor receives low-level transfer signals, a first end of the third controllable transistor is connected to a first end of the sixth controllable transistor and a first end of the eighth controllable transistor and receives the turn-on voltage, a second end of the third controllable transistor is connected to a first end of the fourth controllable transistor, a first end of the fifth controllable transistor, the seventh controllable transistor and the ninth controllable transistor, a second end of the ninth controllable transistor, and a control end of the second controllable transistor; a control end of the fourth controllable transistor is connected to the second end of the first controllable transistor, a second end of the fourth controllable transistor is connected to a second end of the fifth controllable transistor (T5), the second end of the second controllable transistor, and the scanning output circuit, and the second end of the fourth controllable transistor receives the turn-off voltage; a control end of the fifth controllable transistor receives high-level scanning signals, a control end of the sixth controllable transistor receives first clock signals, a second end of the sixth controllable transistor is connected to a first end of the seventh controllable transistor, a control end of the seventh controllable transistor receives the second clock signals, a control end of the eighth controllable transistor receives the third clock signals, a second end of the eighth controllable transistor is connected to a first end of the ninth controllable transistor, and a control end of the ninth controllable transistor receives the fourth clock signals.

10. The display panel as claimed in claim 9, wherein the scanning output circuit comprises a tenth controllable transistor through a thirteenth controllable transistor and a capacitor, a control end of the tenth controllable transistor is connected to the second end of the first controllable transistor, the first end of the second controllable transistor, and a control end of the eleventh controllable transistor, a first end of the tenth controllable transistor is connected to a first end of the eleventh controllable transistor and receives the fourth clock signals, a second end of the tenth controllable transistor receives current-level transfer signals, a second end of the eleventh controllable transistor is connected to a scanning signal output end for outputting the current-level transfer signals and a first end of the thirteenth controllable transistor, a control end of the thirteenth controllable transistor receives the second clock signals, a second end of the thirteenth controllable transistor is connected to the second end of the twelfth controllable transistor, the second end of the second controllable transistor, the second end of the fifth controllable transistor, and the second end of the fourth controllable transistor, and receives the turn-off voltage; a control end of the twelfth controllable transistor is connected to the control end of the second controllable transistor, a first end of the twelfth controllable transistor is connected to the second end of the eleventh controllable transistor, the first end of the thirteenth controllable transistor, and the scanning signal output end; and the capacitor connects between the control end of the tenth controllable transistor and the first end of the twelfth controllable transistor.

11. The display panel as claimed in claim 10, wherein the first through the thirteenth controllable transistors are N-type IGZO TFTs, and the control ends, the first ends, and the second ends of the first through the thirteenth controllable transistors respectively corresponds to a gate, a drain, and a source of the N-type IGZO TFTs.

12. The display panel as claimed in claim 10, wherein a level of the second clock signals is opposite to that of the fourth clock signals, and a level of the third clock signals is opposite to that of the first clock signals, a duty cycle ratio of the first to the fourth clock signals is 50%, an overlapped period of two adjacent clock signals is about half of the width of the clock signals, a voltage of the first to the fourth clock signals is in a range from −8V to 28V, the turn-on voltage is 29V, and the turn-off voltage is −6V.

13. The display panel as claimed in claim 9, wherein the pull-down control circuit comprises a third controllable transistor through a ninth controllable transistor, a control end of the third controllable transistor receives low-level transfer signals, a first end of the third controllable transistor is connected to a first end of the sixth controllable transistor and a first end of the eighth controllable transistor and receives the turn-on voltage, a second end of the third controllable transistor is connected to a first end of the fourth controllable transistor, a first end of the fifth controllable transistor, the seventh controllable transistor and the ninth controllable transistor, a second end of the ninth controllable transistor, and a control end of the second controllable transistor; a control end of the fourth controllable transistor is connected to the second end of the first controllable transistor, a second end of the fourth controllable transistor is connected to a second end of the fifth controllable transistor, the second end of the second controllable transistor, and the scanning output circuit, and the second end of the fourth controllable transistor receives the turn-off voltage; a control end of the fifth controllable transistor receives high-level scanning signals, a control end of the sixth controllable transistor receives second clock signals, a second end of the sixth controllable transistor is connected to a first end of the seventh controllable transistor, a control end of the seventh controllable transistor receives the third clock signals, a control end of the eighth controllable transistor receives the fourth clock signals, a second end of the eighth controllable transistor is connected to a first end of the ninth controllable transistor, and a control end of the ninth controllable transistor receives the first clock signals;

wherein the scanning output circuit comprises a tenth controllable transistor through a thirteenth controllable transistor and a capacitor, a control end of the tenth controllable transistor is connected to the second end of the first controllable transistor, the first end of the second controllable transistor, and a control end of the eleventh controllable transistor, a first end of the tenth controllable transistor is connected to a first end of the eleventh controllable transistor and receives the fourth clock signals, a second end of the tenth controllable transistor receives current-level transfer signals, a second end of the eleventh controllable transistor is connected to a scanning signal output end for outputting the current-level transfer signals and a first end of the thirteenth controllable transistor, a control end of the thirteenth controllable transistor receives the second clock signals, a second end of the thirteenth controllable transistor is connected to the second end of the twelfth controllable transistor, the second end of the second controllable transistor, the second end of the fifth controllable transistor, and the second end of the fourth controllable transistor, and receives the turn-off voltage; a control end of the twelfth controllable transistor is connected to the control end of the second controllable transistor, a first end of the twelfth controllable transistor connects to is connected to the second end of the eleventh controllable transistor, the first end of the thirteenth controllable transistor, and the scanning signal output end; and the capacitor connects between the control end of the tenth controllable transistor and the first end of the twelfth controllable transistor.

14. The display panel as claimed in claim 9, wherein the pull-down control circuit comprises a third controllable transistor through a ninth controllable transistor, a control end of the third controllable transistor receives low-level transfer signals, a first end of the third controllable transistor is connected to a first end of the sixth controllable transistor and a first end of the eighth controllable transistor and receives the turn-on voltage, a second end of the third controllable transistor is connected to a first end of the fourth controllable transistor, a first end of the fifth controllable transistor, the seventh controllable transistor and the ninth controllable transistor, a second end of the ninth controllable transistor, and a control end of the second controllable transistor; a control end of the fourth controllable transistor is connected to the second end of the first controllable transistor, a second end of the fourth controllable transistor is connected to a second end of the fifth controllable transistor, the second end of the second controllable transistor, and the scanning output circuit, and the second end of the fourth controllable transistor receives the turn-off voltage; a control end of the fifth controllable transistor receives high-level scanning signals, a control end of the sixth controllable transistor receives third clock signals, a second end of the sixth controllable transistor is connected to a first end of the seventh controllable transistor, a control end of the seventh controllable transistor receives the fourth clock signals, a control end of the eighth controllable transistor receives the first clock signals, a second end of the eighth controllable transistor is connected to a first end of the ninth controllable transistor, and a control end of the ninth controllable transistor receives the second clock signals;

wherein the scanning output circuit comprises a tenth controllable transistor through a thirteenth controllable transistor and a capacitor, a control end of the tenth controllable transistor is connected to the second end of the first controllable transistor, the first end of the second controllable transistor, and a control end of the eleventh controllable transistor, a first end of the tenth controllable transistor is connected to a first end of the eleventh controllable transistor and receives the fourth clock signals, a second end of the tenth controllable transistor receives current-level transfer signals, a second end of the eleventh controllable transistor is connected to a scanning signal output end for outputting the current-level transfer signals and a first end of the thirteenth controllable transistor, a control end of the thirteenth controllable transistor receives the second clock signals, a second end of the thirteenth controllable transistor is connected to the second end of the twelfth controllable transistor, the second end of the second controllable transistor, the second end of the fifth controllable transistor, and the second end of the fourth controllable transistor, and receives the turn-off voltage; a control end of the twelfth controllable transistor is connected to the control end of the second controllable transistor, a first end of the twelfth controllable transistor is connected to the second end of the eleventh controllable transistor, the first end of the thirteenth controllable transistor, and the scanning signal output end; and the capacitor connects between the control end of the tenth controllable transistor and the first end of the twelfth controllable transistor.

15. The display panel as claimed in claim 9, wherein the pull-down control circuit comprises a third controllable transistor through a ninth controllable transistor, a control end of the third controllable transistor receives low-level transfer signals, a first end of the third controllable transistor is connected to a first end of the sixth controllable transistor and a first end of the eighth controllable transistor and receives the turn-on voltage, a second end of the third controllable transistor is connected to a first end of the fourth controllable transistor, a first end of the fifth controllable transistor, the seventh controllable transistor and the ninth controllable transistor, a second end of the ninth controllable transistor, and a control end of the second controllable transistor; a control end of the fourth controllable transistor is connected to the second end of the first controllable transistor, a second end of the fourth controllable transistor is connected to a second end of the fifth controllable transistor, the second end of the second controllable transistor, and the scanning output circuit, and the second end of the fourth controllable transistor receives the turn-off voltage; a control end of the fifth controllable transistor receives high-level scanning signals, a control end of the sixth controllable transistor receives fourth clock signals, a second end of the sixth controllable transistor is connected to a first end of the seventh controllable transistor, a control end of the seventh controllable transistor receives the first clock signals, a control end of the eighth controllable transistor receives the first clock signals, a second end of the eighth controllable transistor is connected to a second end of the ninth controllable transistor, and a control end of the ninth controllable transistor receives the third clock signals;

wherein the scanning output circuit comprises a tenth controllable transistor through a thirteenth controllable transistor and a capacitor, a control end of the tenth controllable transistor is connected to the second end of the first controllable transistor, the first end of the second controllable transistor, and a control end of the eleventh controllable transistor, a first end of the tenth controllable transistor is connected to a first end of the eleventh controllable transistor and receives the fourth clock signals, a second end of the tenth controllable transistor receives current-level transfer signals, a second end of the eleventh controllable transistor is connected to a scanning signal output end for outputting the current-level transfer signals and a first end of the thirteenth controllable transistor, a control end of the thirteenth controllable transistor receives the second clock signals, a second end of the thirteenth controllable transistor is connected to the second end of the twelfth controllable transistor, the second end of the second controllable transistor, the second end of the fifth controllable transistor, and the second end of the fourth controllable transistor, and receives the turn-off voltage; a control end of the twelfth controllable transistor is connected to the control end of the second controllable transistor, a first end of the twelfth controllable transistor is connected to the second end of the eleventh controllable transistor, the first end of the thirteenth controllable transistor, and the scanning signal output end; and the capacitor connects between the control end of the tenth controllable transistor and the first end of the twelfth controllable transistor.

* * * * *